United States Patent
Lee et al.

(10) Patent No.: US 8,289,032 B2
(45) Date of Patent: Oct. 16, 2012

(54) INTEGRATED CIRCUIT HAVING RECEIVER JITTER TOLERANCE ("JTOL") MEASUREMENT

(75) Inventors: Hae-Chang Lee, Belmont, CA (US); Jaeha Kim, Mountain View, CA (US); Brian Leibowitz, San Francisco, CA (US)

(73) Assignee: Rambus Inc., Sunnyvale, CA (US)

( * ) Notice: Subject to any disclaimer, the term of this patent is extended or adjusted under 35 U.S.C. 154(b) by 336 days.

(21) Appl. No.: 12/529,320

(22) PCT Filed: Mar. 19, 2008

(86) PCT No.: PCT/US2008/057455
§ 371 (c)(1), (2), (4) Date: Aug. 31, 2009

(87) PCT Pub. No.: WO2008/115968
PCT Pub. Date: Sep. 25, 2008

(65) Prior Publication Data
US 2010/0097071 A1    Apr. 22, 2010

Related U.S. Application Data

(60) Provisional application No. 60/895,860, filed on Mar. 20, 2007.

(51) Int. Cl.
*G01R 29/26* (2006.01)
(52) U.S. Cl. .............. 324/613; 324/76.12; 324/614; 702/69
(58) Field of Classification Search .............. 324/76.12, 324/612–614, 537–555, 620–628; 702/69–82; 375/226
See application file for complete search history.

(56) References Cited

U.S. PATENT DOCUMENTS

| | | | | |
|---|---|---|---|---|
| 5,394,106 A | * | 2/1995 | Black et al. | 327/107 |
| 5,654,657 A | * | 8/1997 | Pearce | 327/163 |
| 5,793,822 A | * | 8/1998 | Anderson et al. | 375/371 |
| 6,718,497 B1 | | 4/2000 | Whitby-Strevens | 714/739 |
| 6,760,389 B1 | | 7/2004 | Mukherjee et al. | 375/326 |
| 7,952,516 B2 | * | 5/2011 | Atherton | 342/200 |
| 2004/0223559 A1 | | 11/2004 | Hill | 375/306 |
| 2005/0156586 A1 | | 7/2005 | Kanbayashi | 324/76.53 |

FOREIGN PATENT DOCUMENTS
CA    2302102    9/2000

OTHER PUBLICATIONS

Response to European Office Action filed Aug. 18, 2010 in European Application No. 08744054.1 filed Mar. 19, 2008.
Examination Report date Feb. 17, 2010, European Patent Office, European Patent Application No. 08 744 054.1-2216 filed Mar. 19, 2008.
Extended European Search Report dated Jul. 22, 2011 in Application No. 11165959.5.
EP Response dated Feb. 13, 2012 to the Official Communication dated Jul. 22, 2011 re EP Application No. 11165959.5 includes New Claims (highlighted and clear) and New Description pages. 14 pages.

* cited by examiner

*Primary Examiner* — Jermele M Hollington
*Assistant Examiner* — Alesa Allgood

(57) ABSTRACT

An integrated circuit capable of on-chip jitter tolerance measurement includes a jitter generator circuit to produce a controlled amount of jitter that is injected into at least one clock signal, and a receive circuit to sample an input signal according to the at least one clock signal. The sampled data values output from the receiver are used to evaluate the integrated circuit's jitter tolerance.

22 Claims, 8 Drawing Sheets

INTEGRATED CIRCUIT HAVING RECEIVER JITTER TOLERANCE ("JTOL") MEASUREMENT

CROSS-REFERENCE TO RELATED APPLICATIONS

This application is a national stage of International Application No. PCT/US2008/057455 filed on Mar. 19, 2008, which claims the priority benefit of U.S. Provisional Application No. 60/895,860 filed on Mar. 20, 2007. The contents of the above identified applications are incorporated by reference herein in their entirety.

FIELD OF THE INVENTION

The present invention generally relates to integrated circuits and/or high speed signaling of such circuits.

BACKGROUND OF THE RELATED ART

An integrated circuit may be evaluated by its tolerance to noise or jitter in a received signal. An integrated circuit's, and or system's, performance may be measured by measuring a number of erroneous bits (or erroneous data values) that occur during the transfer of a particular number or bits. This performance metric is known as a Bit-Error-Ratio ("BER") value.

An integrated circuit's (or system's) BER value may be measured by an expensive specialized test system. The cost of the test system and the time required in testing performance of an integrated circuit under a variety of test conditions may significantly contribute to the overall cost of manufacturing the integrated circuit.

FIG. 1 illustrates a test system 100 for testing a device under test ("DUT") 140, such as a semiconductor integrated circuit ("IC"). In particular, test system 100 may be used to obtain a BER value for DUT 140 when particular jitter signals are introduced. Test system 100 includes a BER test equipment 120, a signal generator 110, a random jitter ("RJ") source 108, a sinusoidal jitter ("SJ") source 109, a sum circuit 111 and a backplane 130. Signal generator 110, source 108 and source 109 may be included in BER test equipment 120.

In a test mode, DUT 140 is coupled to BER test equipment 120. One or more receivers 142 of DUT 140 is coupled to one or more transmitters 120A of BER test equipment 120 by way of backplane 130. One or more transmitters 144 of DUT 140 are coupled to one or more receivers 120B of BERT 120 by way of an interconnect (such as a cable). Backplane 130 may provide a known deterministic jitter ("DJ") or noise to data signals transferred from BER test equipment 120 to DUT 140. Backplane 130 may introduce inter-symbol-interference ("ISI") which DUT 140 may encounter in a system when receiving and/or transferring data signals.

Sum circuit 111 sums random noise or an RJ signal and a sinusoidal signal or SJ signal from sources 108 and 109 and outputs a delay control signal. Signal generator 110 outputs a noisy clock signal (or transmit clock/frequency) to transmitter 120A that outputs a data signal in response to the data value provided by pseudo random bit sequence ("PRBS") generator 120C.

A "noisy" clock signal is provided to transmitter 120A (or a clock signal that has been modulated with one or more jitter signals) to observe the tolerance of the receivers 142 to jitter signals (RX JTOL) or BER performance of DUT 140. For example, data signals are transmitted from BER test equipment 120 to DUT 140 in response to the noisy clock signal. DUT 140 receives the data and then retransmits the data values (the data values may be first stored in a storage circuit of DUT 140) back to the receiver 120B. A compare circuit 120D then outputs an error signal when the data value from receiver 120B does not match or equal the original transmitted data from PRBS generator 120C (PRBS generator 120C may also include a storage circuit to store data values that were output by transmitter 120A). A number of bit (data value) errors or error signals per number of data values transmitted/received by BER test equipment 120 equals a BER value corresponding to the RJ, SJ, and DJ that corrupt the data signal.

It is desirable to measure an integrated circuit's noise tolerance without the use of expensive specialized test equipment. The elimination and/or reduction of the expensive specialized test equipment then may reduce the cost and time in manufacturing/testing an integrated circuit.

BRIEF DESCRIPTION OF THE DRAWING

Embodiments are illustrated by way of example, and not by way of limitation, in the figures of the accompanying drawing. Like reference numerals refer to similar elements.

DETAILED DESCRIPTION

The jitter tolerance (JTOL) of a receiver (RX) is an industry standard measure of how much unwanted timing noise (jitter) the RX can tolerate while achieving a target bit-error-ratio (BER). There are three major components of jitter involved in JTOL testing—Random Jitter (RJ), Deterministic Jitter (DJ), and Sinusoidal Jitter (SJ). While a controlled amount of DJ can be introduced into a high-speed data stream by passing the data stream though a channel (e.g. a PCB trace) that adds inter-symbol interference (ISI), the introduction of RJ and SJ often require expensive equipment. Furthermore, it is desired that the amount of RJ and SJ as well as the frequency of the SJ be variable to fully characterize the RX.

Figure 1:
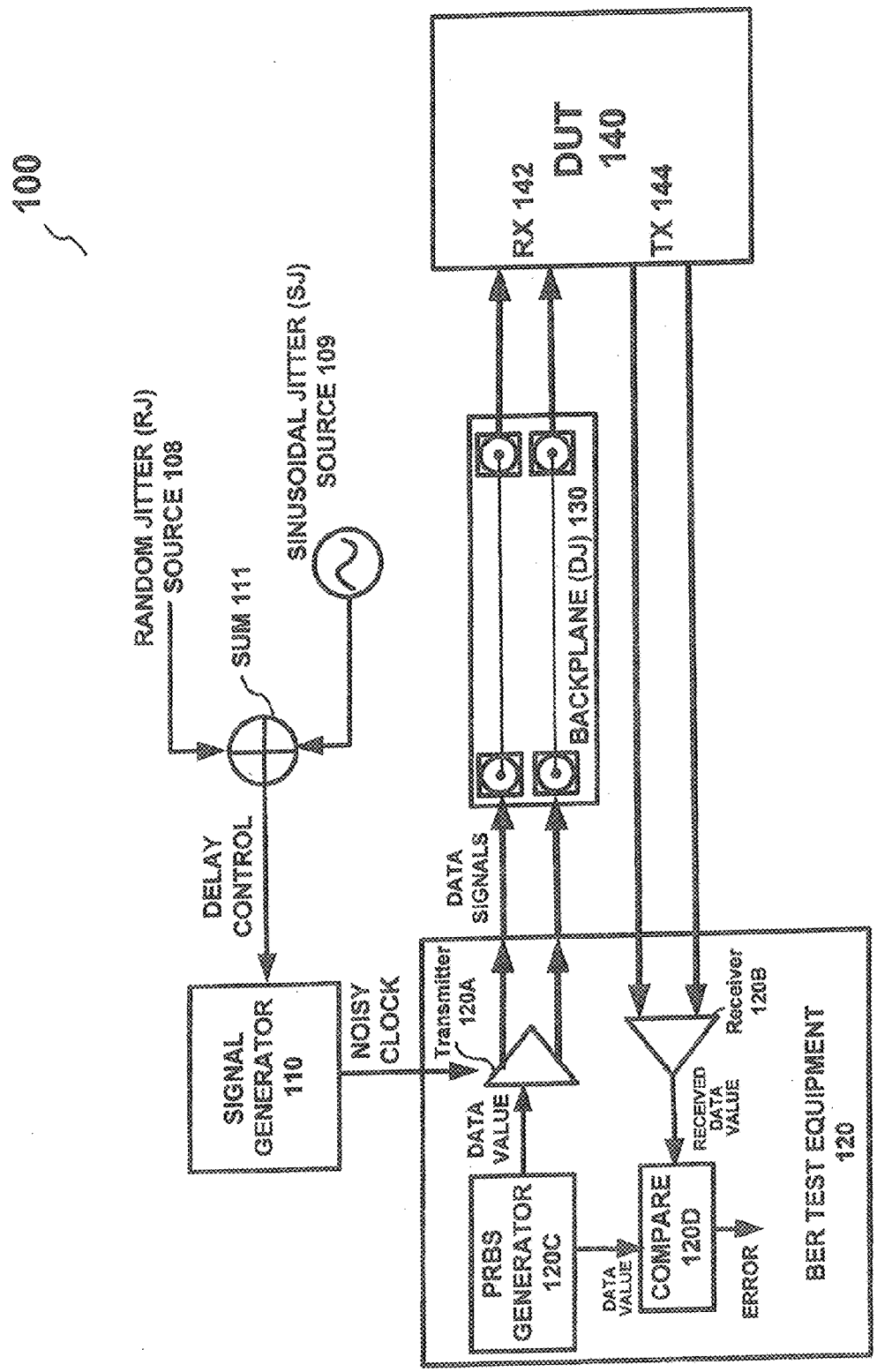
FIG. 1 illustrates a conventional test system.
Figures 2, 3:
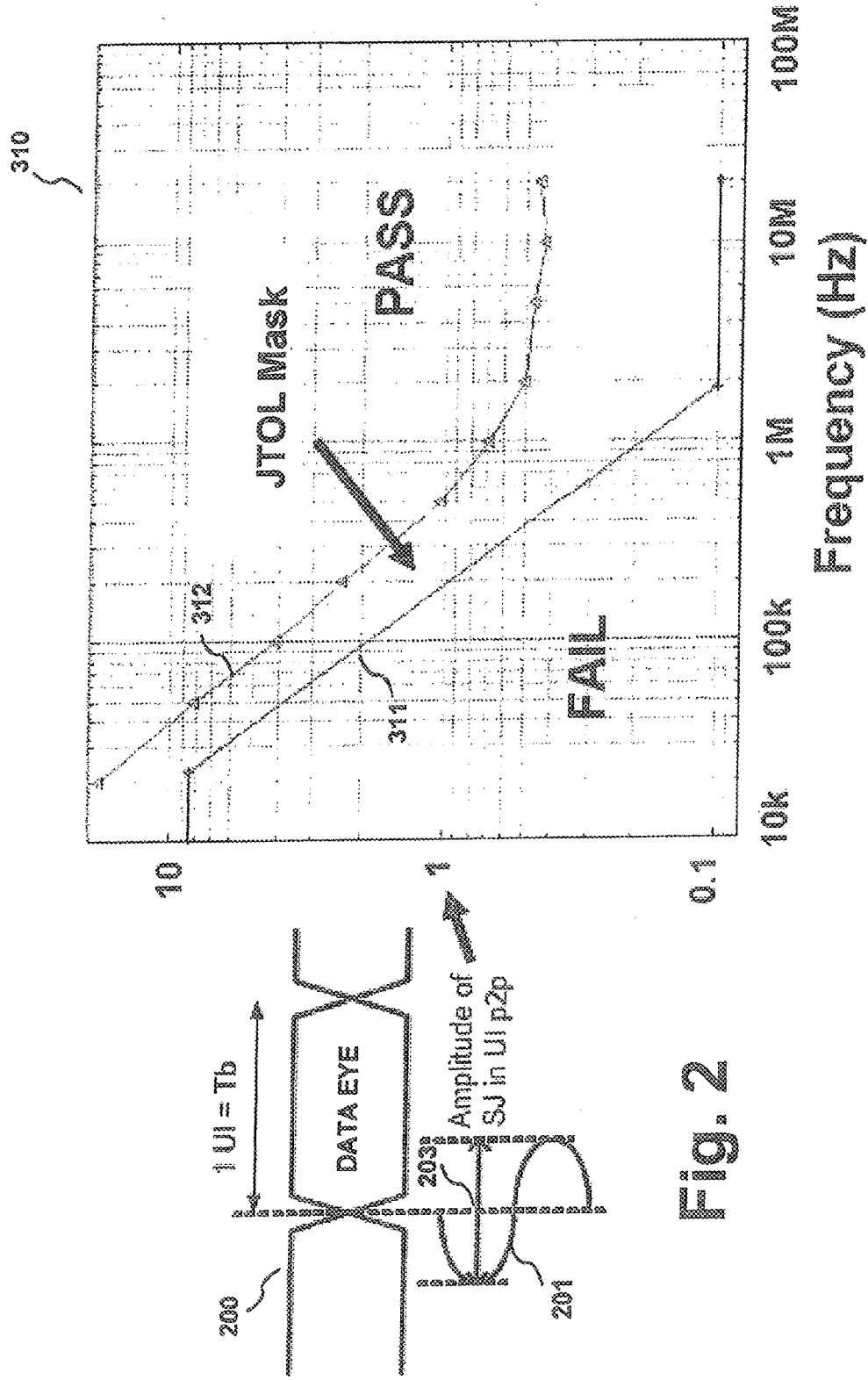
FIG. 2 illustrates the effect of SJ on a data signal.
FIG. 3 illustrates a jitter tolerance graph.

FIG. 2 illustrates the effect of adding SJ 201 having peak-to-peak amplitude 203 to a data signal 200. SJ 201 shifts the edges of the data signal 200 with respect to where the edges would have occurred in time had SJ 201 not been added. How far the edges are disturbed is related to the amplitude of the SJ 201. How quickly this disturbance varies is related to the frequency of the SJ 201. In this FIG. 2, "UI" denotes a 1 unit interval and may represent a nominal time period of a bit or an interval of time for receiving a data signal in an embodiment.

FIG. 3 illustrates a JTOL graph 310. In this example, at a given frequency of the SJ (e.g. 1 MHz), the peak-to-peak ("p2p") amplitude of the SJ is increased until the RX's measured BER degrades to a target BER. This target BER is typically $10^{-12}$ or $10^{-15}$ depending on product specification or industry standard. The frequency of the SJ is the x-axis of the graph 310 and the p2p amplitude at which the target BER occurs is recorded in the y-axis. This measurement repeats over various SJ frequencies and generates a curve 312. In this example, the amount of RJ is constant. Furthermore in this example, curve 311 ("JTOL Mask") denotes a minimum SJ that the RX must tolerate before degrading to the target BER in order to pass the industry specification (e.g. XAUI). Hence, the measured curve 312 being above curve 311 would be characteristic of a good IC part. This is simply an illustrative example and there are other variants of defining JTOL. For instance, another specification may require JTOL measured with the SJ having a fixed frequency and amplitude while the RJ amplitude is increased. In almost all JTOL evaluation, a means of generating a variable SJ and RJ is needed for characterizing the performance of a RX.

Embodiments of the present disclosure include on-chip circuits that can generate SJ with variable amplitude and frequency and RJ with variable amplitude. Such on-chip circuits eliminate or reduce the need for expensive specialized test equipment and reduce the time required for manufacturing/testing an integrated circuit.

An integrated circuit ("IC"), among other embodiments, includes one or more jitter generator circuits to output at least one jitter signal so that at least one receive clock signal is adjusted (or is noisy). A jitter signal, such as an SJ or RJ signal, may be input to a Clock and Data Recovery ("CDR") circuit coupled to one or more receivers that obtain data values and edge values from an input signal. An input signal is sampled by a receiver circuit using the adjusted receive clock signal to obtain a received data value. A stored (or expected/predetermined) data value is input, along with the received data value, to a compare circuit that outputs an error signal when the received data value does not match or equal the stored expected data value. The stored data values may be output by a data generator circuit, such as a PRBS generator circuit. The error signals may be input to a counter that stores a count value that represents a performance metric/tolerance of the IC, such as a BER value, for a particular jitter signal. A control circuit may output control signals to initialize one or more jitter generator circuits and to synchronize the compare circuit.

In an embodiment, an IC operates in a first and second mode of operation. In the first mode of operation (or a test/calibrate/initialization mode), a jitter signal is generated in response to a control signal and used to adjust a receive clock signal. Received data values using the adjusted or noisy receive clock signal are then compared to predetermined data values so that a BER value may be obtained or jitter tolerance may be measured. In the second mode of operation (or typical/normal mode), a jitter signal is not generated in response to the control signal and data values are sampled or received using a receive clock signal that does not include a jitter signal.

In further embodiments, jitter generator circuits include circuits that provide approximate SJ, SJ and RJ signals to a CDR circuit that in turn outputs adjusted (noisy) receive clock signals to receiver circuits. A circuit may also be included that provides a frequency offset to at least one receive clock signal.

In an exemplary embodiment, an IC includes a plurality of receiver circuits coupled to a CDR circuit and one or more jitter generator circuits. A first receiver circuit samples an input signal to obtain a data value in response to a data clock signal. A second receiver circuit samples the input signal to obtain an edge value in response to an edge clock signal. The CDR circuit includes a phase detector coupled to the first and second receiver circuits. The phase detector outputs an adjust signal (via a $K_I$ multiply circuit) to a frequency accumulator that outputs a frequency signal. A sum circuit outputs a sum of the frequency signal and the adjust signal (via a $K_p$ multiply circuit) to the phase accumulator that outputs a phase signal. A clock alignment circuit, such as a phase lock loop ("PLL") or delay lock loop ("DLL"), in the CDR circuit receives a reference clock signal so that a plurality of clock signals are output to a phase interpolator that generates the data and edge clock signals whose phase is responsive to the output of the phase accumulator. One or more jitter generator circuits, such as a square wave generator circuit, binary counter and storage circuit or PRBS circuit, output jitter signals to the CDR circuit so that the receive clock signal is adjusted during a mode of operation that determines jitter tolerance.

Figure 4:
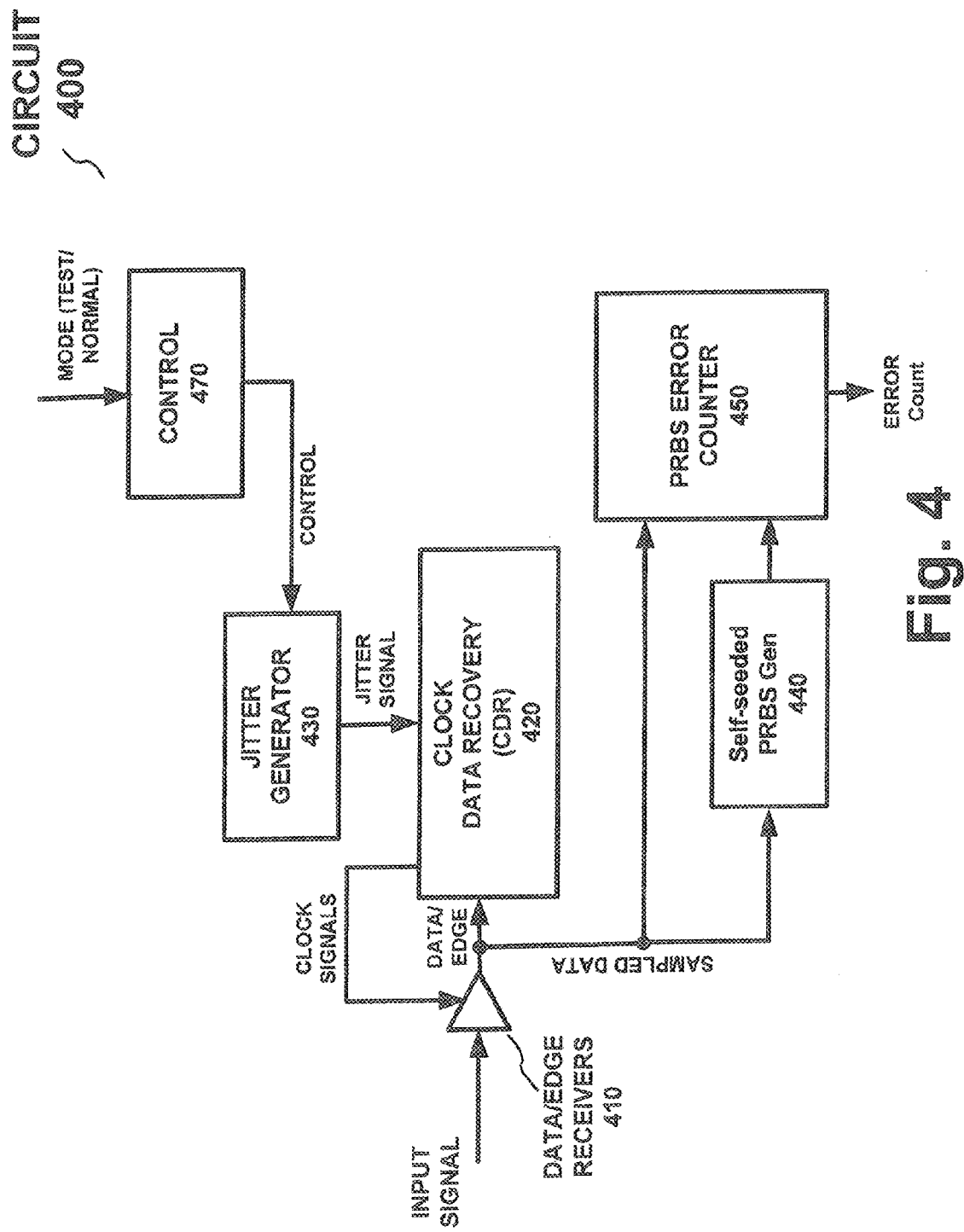
FIGS. 4-8 illustrate circuits having receiver jitter tolerance measurement capabilities according to various embodiments.

FIG. 4 illustrates a circuit 400 including data/edge receivers 410, clock and data recovery ("CDR") 420, control 470 and jitter generator 430, among other circuit components, according to embodiments. Jitter generator 430 outputs an SJ and/or RJ signal to CDR 420. In an embodiment, jitter generator 430 outputs a jitter signal having controlled characteristics, such as a controlled predetermined wave shape, amplitude and/or frequency, singly or in combination. FIGS. 5-8 illustrate embodiments of providing SJ and RJ signals to a CDR circuit as well as providing a frequency offset. CDR 420 outputs a clock signal that has been adjusted (or a noisy clock signal) in response to the jitter signal output from jitter generator 430. Accordingly, one or more of the receivers in data/edge receivers 410 sample data and/or edge values in response to one or more clock signals that have noise or jitter added.

In embodiments, data/edge receivers 410 may be included in CDR 420. In embodiments, two data and two edge receivers sample an input signal to output two data and two edge values in response to two data and two edge clocks output from CDR 420. The four clock signals may be respectively offset by ninety degrees.

Figure 5:
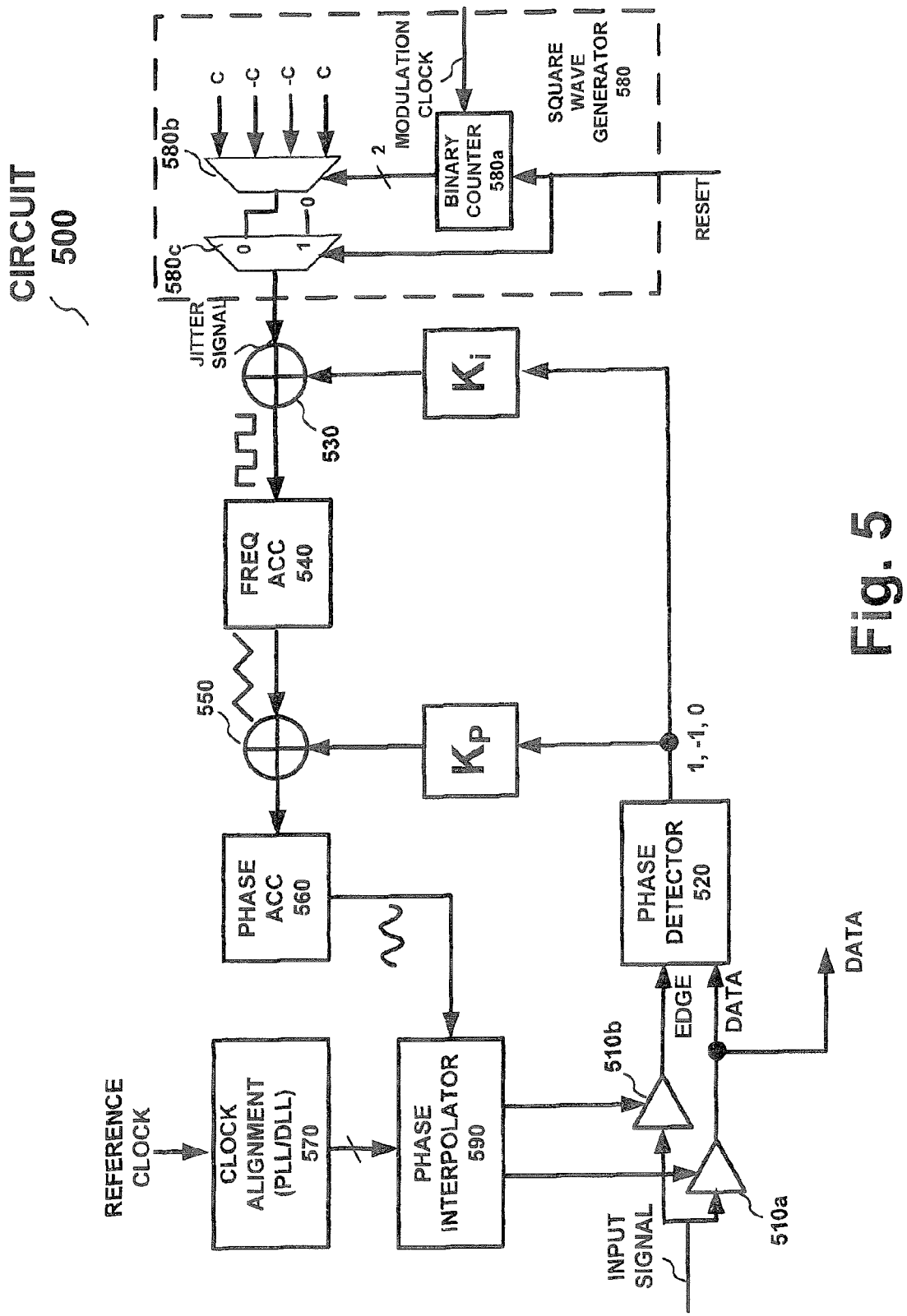
Figure 6:
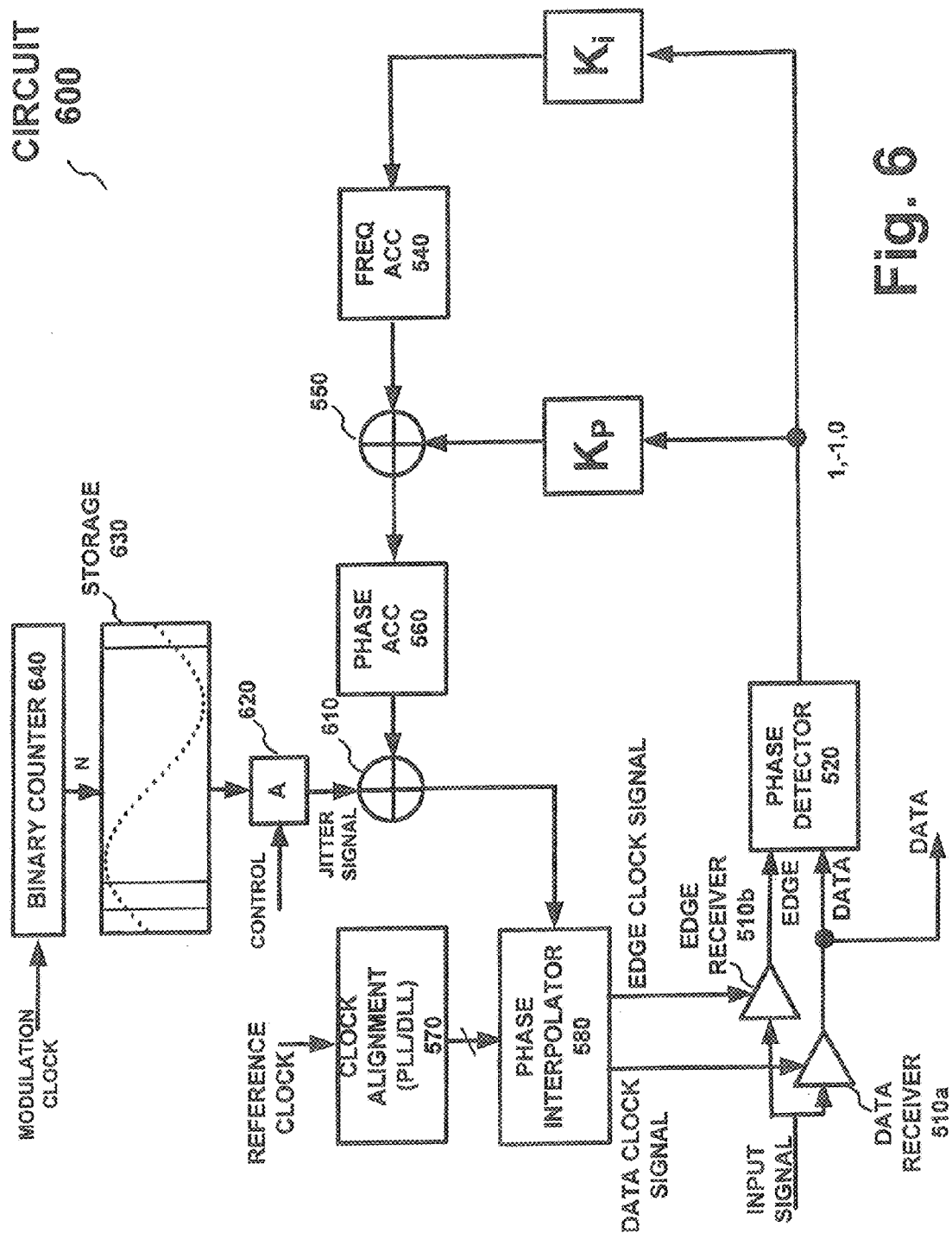
Figure 7:
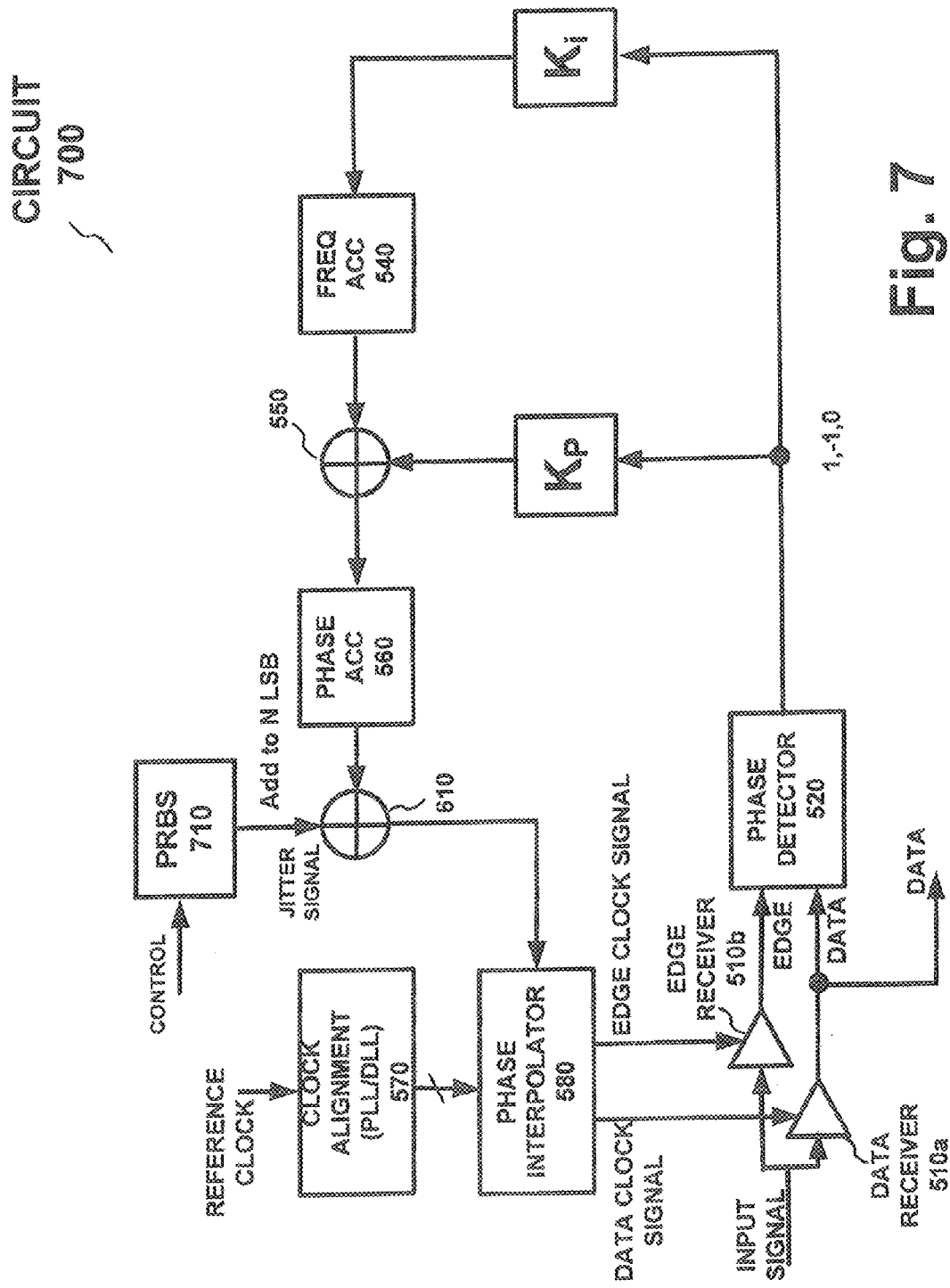

More than one jitter generator 430, as illustrated in FIGS. 5-7, may be used to provide different types of jitter signals (DJ, RJ and SJ) at the same time.

Data values from data/edge receivers 410 may be output to a PRBS error counter 450 which may be used in conjunction with another counter (not shown) to record the number of data values or bits received, from which BER can be calculated. In embodiments, an error signal and/or count values may be provided to a register interface (not shown). Data values are also output from data/edge receivers 410 to self-seeded PRBS generator 440 which outputs a set of expected or known data values to PRBS error counter 450 in response to the sampled data values. A number of erroneous bits (error count) is obtained by the PRBS error counter 450 comparing the sampled data values to the output of the self-seeded PRBS generator 440. The error count then may be divided by the total number of bits received to calculate a BER value. A number of total bits received may be calculated in software by multiplying a bit rate (bits/sec) with an observation time (in seconds). A general purpose-processing device that includes software, such as personal computer, may access the count and/or error values from the register interface (or counters) to calculate a BER value in embodiments.

In embodiments, control 470 outputs control signals to jitter generator 430 in response to a mode (test/normal) signal. In embodiments, a mode signal indicates whether circuit 400 operates in a test/calibration/initialization mode or typical/normal mode of operation. A mode signal may be generated internally in response to a digital value indicating a mode of operation stored in a storage circuit, or register, or provided from an external source, such as from a programmable fuse or external bus/interconnect. For example, a mode signal may be generated in response to values received from an input signal at data/edge receivers 410. In embodiments, control 470 provides constant values, reset signals and/or synchronization signals to circuit 400, including jitter generator 430 in response to the mode signal. In an embodiment, control 470 may be external to circuit 400.

FIG. 5 illustrates a circuit 500 which is an exemplary embodiment of circuit 400. Circuit 500 includes a CDR circuit that includes a phase detector 520, multiplier circuits $K_p$ and $K_I$, sum circuits 530 and 550, a frequency ("freq") accumulator ("acc") 540, a phase acc 560, a clock alignment circuit 570 (such as a PLL/DLL circuit) and a phase interpolator 590. A square wave generator 580 that corresponds to jitter generator 430 outputs a jitter signal in the form of a square wave to sum circuit 530. Data and edge receivers 510a and 510b correspond to data/edge receivers 410. In alternate embodiments, other circuit components may be included in circuit 500, such as loop filters, equalizer circuits and de-serializer circuits. In embodiments, portions of circuit 500 are included in a digital circuit, such as a field programmable gate array ("FPGA") that outputs analog values by a digital-to-analog converter. For example, multiplier circuits $K_p$ and $K_i$, sum circuits 530 and 550, freq acc 540, phase acc 560, clock alignment circuit 570 and phase interpolator 590 may be included in a digital circuit.

In an operation of circuit 500, an input signal is sampled by data receiver 510a and edge receiver 510b, which output data and edge values in response to a data clock signal and an edge clock signal, respectively. As described above, more receivers and clock signals may be used to sample the input signal in other embodiments. Edge and data values are input to a phase detector 520 to determine the relative time/phase between the input signal and the receive clock signals and to output an up/down/hold signal to multiplier circuits $K_p$ and $K_i$. In an embodiment, an up/down/hold signal is a two bit digital signal represented as 1, −1, and 0 in 2's complement binary. Multiplier circuits $K_p$ and $K_i$ multiply the up/down/hold signals by respective constants (such as a proportional and integral constant) and outputs the products to inputs of sum circuits 550 and 530. Freq Acc 540 provides another input (a frequency signal) to sum circuit 550 that outputs a sum of the inputs to phase acc 560. Square wave generator 580 outputs a jitter signal to another input of sum circuit 530 that outputs a sum of the inputs to freq Acc 540. Phase acc 560 outputs a phase signal to phase interpolator circuit 590 in response to the output of sum circuit 550. Clock alignment circuit 570 may be a PLL or DLL circuit that provides a plurality of clock signals to a phase interpolator 590 in response to a reference clock signal. In embodiments, the reference clock signal may be provided external to circuit 500 or generated internally. Phase interpolator 590 outputs at least data and edge clock signals to data and edge receivers 510a-b in order to synchronize the sampling of the data and edge values. Inputting a jitter signal into sum circuit 530 enables at least one of the data and clock signals to be adjusted (or summed with a jitter signal) so that jitter tolerance may be measured.

Square wave generator 580 outputs a jitter signal in the form of a square wave signal to sum circuit 530. This disturbance when passing through Freq acc 540 becomes a triangle wave. This triangle wave after passing through Phase acc 560 emulates approximately an SJ signal composed of parabolas. By introducing (or adding) this approximate SJ signal to phase interpolator 590, the receive clock signals are adjusted so that jitter tolerance may be measured. An amplitude and frequency of the approximate SJ signal may be determined by inputs to square wave generator 580.

In an embodiment, square wave generator 580 includes a binary counter 580a, a selector 580b, such as a multiplexer, and a multiplexer 580c for setting/disabling the test mode. Selector 580b outputs a selected constant value (C, −C, −C, C) as an input to sum circuit 530 in response to an output from binary counter 580a. Constant values (C, −C, −C, C) may be stored and output from a storage circuit or register in a control circuit, such as control 470. In an embodiment, constant values (C, −C, −C, C) may be provided by an external source, such a controller or test equipment, during testing, initialization or during calibration mode of operation. The magnitude of C determines the amplitude of the SJ. An output of binary counter 580a is timed by a modulation clock. The relationship between the SJ frequency and the modulation clock frequency is determined by the 2 bits from the binary counter 580a that are used to control selector 580b. When the least significant two bits are used, the SJ frequency is 4 times slower than the modulation clock frequency. If an eight bit counter is used and the two most significant bits are used to control the selector 580b, then the SJ frequency is $1/256$ times the modulation frequency. In an embodiment, square wave generator 580 receives a reset signal from the control circuit in order to initiate the timing of the output of the jitter signal. For example, a reset signal may zero out or initialize binary counter 580a. This reset signal is used so as to avoid unintentionally adding a frequency offset in addition to the SJ. Furthermore, the reset signal is input to multiplexer 580c to zero out the jitter input during normal operation. Accordingly, the constant values (C, −C, −C, C) determine the amplitude of the jitter signal and the binary counter output determines the frequency of the SJ signal caused by the square wave generator 580.

FIG. 6 illustrates circuit 600 which is an exemplary embodiment of circuit 400. Circuit 600 includes similar circuits shown in FIG. 5 and operates similarly to circuit 500. However, circuit 600 includes a jitter circuit generator that includes binary counter 640, storage circuit 630, multiplier circuit A and sum circuit 610. Storage circuit 630 includes $2^N$ stored digital values representing a sinusoidal signal having predetermined amplitude. Digital sinusoidal values are output from storage circuit 630 in response to binary counter 640 that outputs the N bit address signal in response to a modulation clock. Not shown is a decoder that uses the N bit address to select one entry from the storage at a time. How fast the digital values in storage circuit 630 are traversed (output) determines the frequency of the jitter signal (or SJ signal). An amplitude of the digital sinusoidal signal output from storage circuit 630 may be adjusted by applying a multiplier A whose output is modulo 1UI to the output of storage circuit 630. In an embodiment, the amplitude or scalar of multiplier circuit A may be adjusted in response to a control signal from a control circuit, such as control 470 shown in FIG. 4. Sum circuit 610 sums the output of multiplier circuit A and the output of phase acc 560 and provides a sum to clock alignment circuit 570. Accordingly, circuit 600 adjusts at least one of data and edge clock signals so that BER values for particular jitter signals having predetermined amplitude and frequency or tolerances may be measured.

Circuits 500 and 600 are similar in that they can provide close to sinusoidal jitter signals having amplitudes of several UI that may be needed in tests that use low frequency SJ signals. In an embodiment, circuit 600 generates other types of periodic jitter signals, such as square wave jitter, by only changing the contents of storage 630.

FIG. 7 illustrates circuit 700 which is an exemplary embodiment of circuit 400. Circuit 700 includes similar circuits shown in FIG. 6 and operates similarly to circuit 600. However, circuit 700 includes a jitter circuit generator that outputs an RJ signal instead of an SJ signal. Circuit 700 includes a PRBS 710 instead of (or in addition to) the circuits that provide the SJ signal in circuits 500 and 600.

An RJ signal is emulated by a PRBS 710 that outputs a predetermined random bit pattern/sequence (via sum circuit 610) to N least significant bits ("LSBs") of the output of phase acc 560. Sum circuit 610 outputs a sum of the output of phase acc 560 and the output of PRBS 710 (N LSBs) to phase interpolator 590. A number of LSBs (N) that will be modulated by the output of PRBS 710 may be determined by the intended amount of p2p RJ signal to be added. In an embodiment, a control signal from a control circuit, such as control 470, selects which N LSBs of the phase acc 560 the PRBS 710 output should be summed with.

Figure 8:
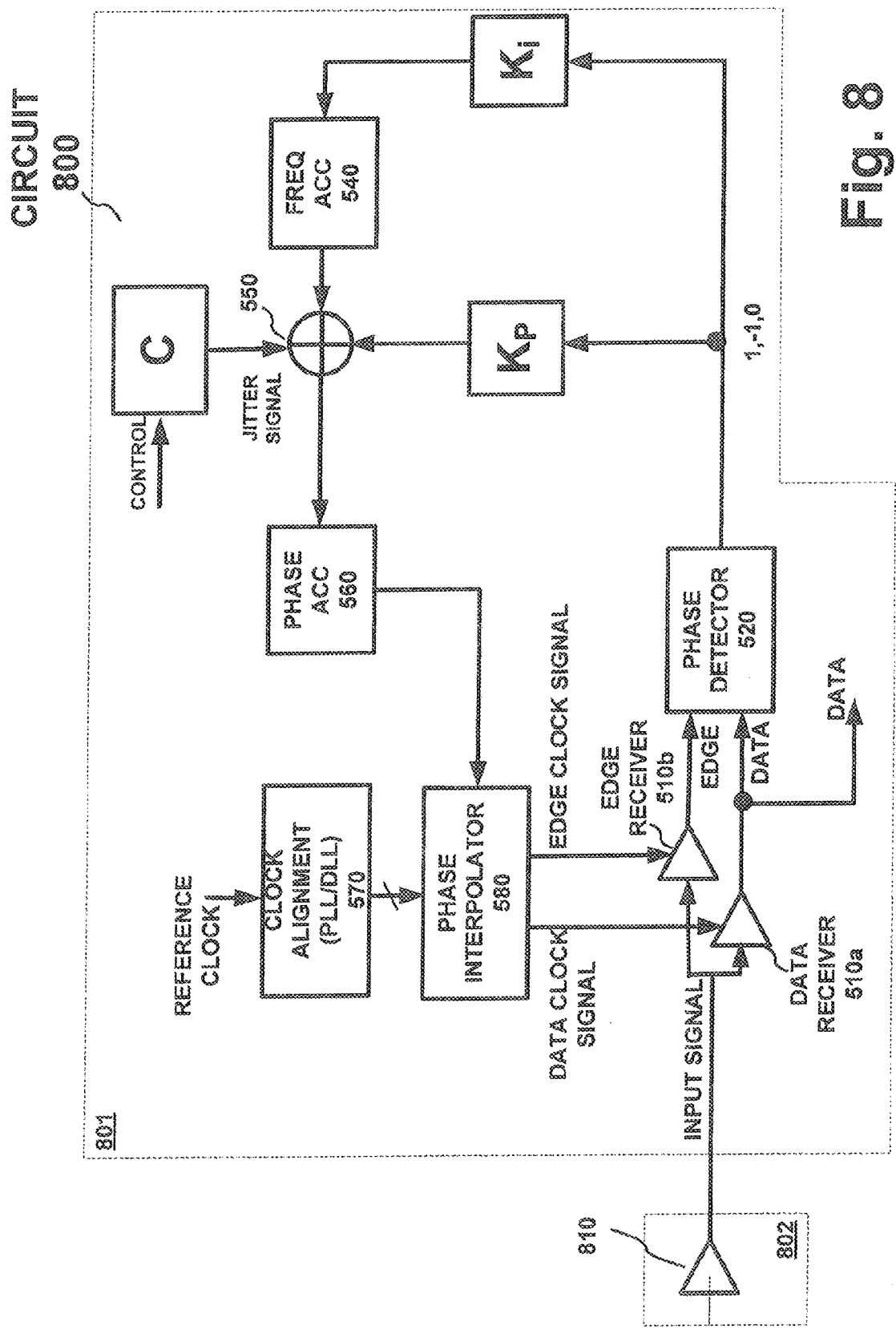

FIG. 8 illustrates circuit 800 which is an exemplary embodiment of circuit 400. Circuit 800 enables evaluation of the performance of an integrated circuit 801 including circuit 800 in the situation of a frequency offset between a transmitter 810 in another integrated circuit 802 and a receiver in integrated circuit 801 without actually causing such a frequency offset. In other words, the evaluation can be performed when the transmitter and the receiver of the input signal are using a same reference clock. Circuit 800 includes similar circuits shown in FIG. 7 and operates similarly to circuit 700. However, circuit 800 includes a constant C that forces a frequency offset at the input of phase acc 560 (via sum circuit 550) instead of an SJ and/or RJ signal. Circuit 700 includes a constant C instead of (or in addition to) the circuits that provide the SJ/RJ signals in circuits 500, 600 and 700. Constant C provides a selected frequency offset to an input of sum circuit 550 in response to a control signal that may be provided by a control circuit. The control signal may indicate the amount of frequency offset to be added.

Figure 9:
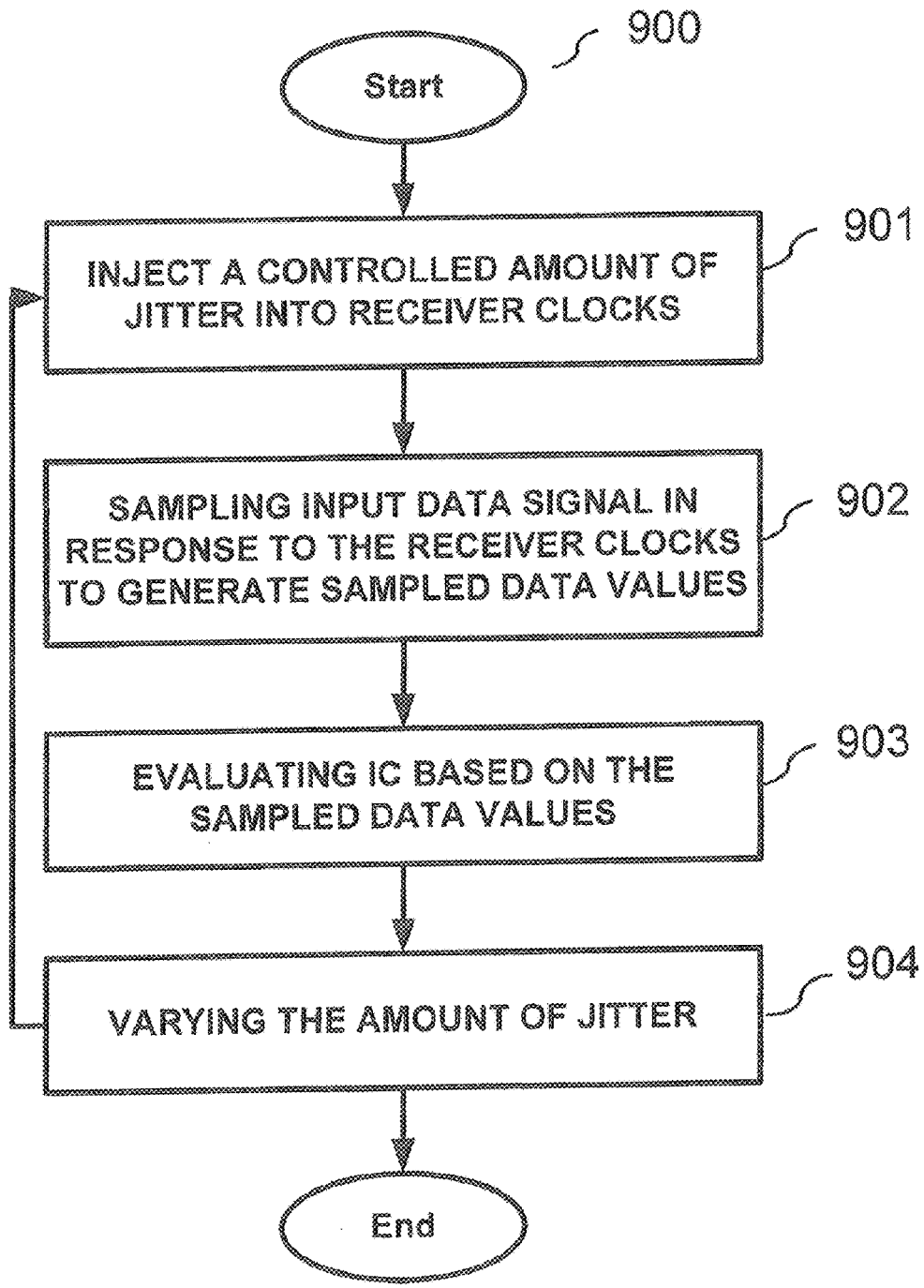
FIG. 9 is a flow chart to illustrate a method for on-chip jitter tolerance measurement according to embodiments.

FIG. 9 illustrates a method 900 for evaluating an IC by adding jitter into at least one receive clock signal and/or measuring a BER value/jitter tolerance. In embodiments, logic blocks illustrated in FIG. 9 illustrate operations/functions of circuits, software or a user, singly or in combination. In embodiments, one or more circuits shown in FIGS. 4-8 carry out method 900. Logic blocks that are not shown may be included in various embodiments; similarly, logic blocks that are shown may be excluded in various embodiments. Also, while method 900 is described in sequential logic blocks, logic blocks of method 900 may be completed concurrently in embodiments.

Method 900 includes the steps of adding a controlled amount of jitter to at least one receive clock signal (901), sampling an input signal to generate sampled data values in response to the at least one receive clock signal (902), and evaluating the IC based on the sampled data values (903). In one embodiment, evaluating the IC includes computing a bit error ratio corresponding to the controlled amount of jitter. Method 900 may further include varying the amount of jitter (904) and repeating steps 901-903 with the varied amount of jitter.

In one embodiment, the IC includes a clock circuit for generating the at least one receive clock signal and the step of adding includes generating at least one jitter signal, and injecting the at least one jitter signal into a clock circuit. As discussed above, the at least one jitter signal may be one or more of a substantially square-wave signal, a substantially triangular wave signal, a digital/substantially sinusoidal signal, an emulated random jitter signal, a constant C signal, and any other suitable jitter signal. Each jitter signal has a controllable frequency and/or controllable amplitude, which may be varied in step 904.

Integrated circuits described herein may be included in various systems or subsystems such as personal computers, graphics cards, set-top boxes, cable modems, cellular telephones, game consoles, digital television sets (for example, high definition television ("HDTV")), fax machines, cable modems, digital versatile disc ("DVD") players or network routers. Integrated circuits described herein may be housed in a variety of different types of packages having different types of external contacts.

In embodiments, conductive paths described herein may include one or a plurality of wires and/or metal traces/regions/signal lines. Multiple conductive paths may replace a single conductive path illustrated in the figures and a single conductive path may replace multiple conductive paths illustrated in the figures.

It should be noted that the various circuits disclosed herein may be described using computer aided design tools and expressed (or represented) as data and/or instructions embodied in various computer-readable media, in terms of their behavior, register transfer, logic component, transistor, layout geometries, and/or other characteristics. Formats of files and other objects in which such circuit expressions may be implemented include, but are not limited to: formats supporting behavioral languages such as C, Verilog, and HLDL; formats supporting register level description languages like RTL; formats supporting geometry description languages such as GDSII, GDSIII, GDSIV, CIF, MEBES; and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.). When received within a computer system via one or more computer-readable media, such data and/or instruction-based expressions of the above described circuits may be processed by a processing entity (e.g., one or more processors) within the computer system in conjunction with execution of one or more other computer programs including, without limitation, netlist generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

The foregoing description of the preferred embodiments has been provided for the purposes of illustration and description. It is not intended to be exhaustive or to limit the embodiments to the precise forms disclosed. Modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An integrated circuit, comprising:
   a jitter generator circuit to produce a jitter signal that is injected into at least one clock signal; and
   a receive circuit to sample an input signal according to the at least one clock signal having the jitter signal, the receive circuit outputting sampled data values that are used to obtain a bit-error-ratio;
   wherein the at least one clock signal having the jitter signal includes at least one data clock signal having the jitter signal and at least one edge clock signal having the jitter signal, and
   wherein the receive circuit comprises:
      at least one first receiver to sample the input signal in response to the at least one data clock signal; and
      at least one second receiver to sample the input signal in response to the at least one edge clock signal.

2. The integrated circuit of claim 1, further comprising:
   an error counter, coupled to the receive circuit, to output an error count value by comparing an expected set of data values with the sampled data values, the error count value used to calculate the bit-error-ratio.

3. The integrated circuit of claim 1, wherein the jitter generator circuit provides the jitter signal by outputting at least one jitter signal in response to a control signal that indicates a first mode of operation for the integrated circuit, the at least one jitter signal each having one or a combination of a predetermined frequency, a predetermined amplitude and a predetermined wave shape, and wherein the jitter generator circuit stops outputting the at least one jitter signal in response to a control signal that indicates a second mode of operation for the integrated circuit.

4. The integrated circuit of claim 3, wherein the at least one jitter signal includes one or more of the group consisting of: a substantially square-wave signal, a substantially triangular wave signal, a substantially sinusoidal signal, an emulated random jitter signal, and a constant frequency offset signal.

5. The integrated circuit of claim 1, further comprising a clock and data recovery circuit coupled between the jitter generator circuit and the receive circuit, the clock and data recovery circuit outputting the at least one clock signal to the receive circuit.

6. The integrated circuit of claim 5, wherein the clock and data recovery circuit comprises:
 a phase detector coupled to the receive circuit;
 a frequency accumulator coupled to the phase detector; and
 a phase accumulator coupled to the frequency accumulator and to the phase detector.

7. The integrated circuit of claim 6, wherein the clock and data recovery circuit further includes one or more of the group consisting of: a first input between the frequency accumulator and the phase detector, a second input between the phase accumulator and the frequency accumulator, and a third input between the phase accumulator and the receive circuit, and wherein the jitter generator circuit produces the jitter signal by outputting one or more jitter signals each with a predetermined amplitude and a predetermined frequency into one or more of the first, second and third inputs to cause the jitter signal to be injected in the at least one clock signal.

8. The integrated circuit of claim 7, wherein the clock and data recovery circuit includes one or more of a first sum circuit, a second sum circuit, and a third sum circuit, and wherein the first, second and third inputs are inputs of respective ones of the first, second and third sum circuits.

9. An integrated circuit comprising:
 a first receiver circuit to sample an input signal in response to a data clock signal;
 a second receiver circuit to sample the input signal in response to an edge clock signal;
 a clock and data recovery circuit to receive sampled data values from the first receiver circuit and sampled edge values from the second receiver circuit, and to output the data and edge clock signals; and
 a jitter generator circuit to output at least one jitter signal to the clock and data recovery circuit so that the data and edge clock signals have a controlled amount of jitter.

10. The integrated circuit of claim 9, wherein the clock and data recovery circuit includes a phase detector, a frequency accumulator, and a sum circuit having a first input coupled to the phase detector, an output coupled to the frequency accumulator, and a second input, and wherein the jitter generator circuit comprises:
 a square wave generation circuit to provide a square wave to the second input of the sum circuit.

11. The integrated circuit of claim 9, wherein the jitter generator circuit comprises:
 a binary counter to output a count value;
 a storage circuit to output at least one value in response to the count value; and
 a multiplication circuit to output a product signal based on the at least one value and a constant value.

12. The integrated circuit of claim 9, wherein the clock and data recovery circuit includes a phase accumulator having an output, the jitter generator circuit comprises:
 a pseudo-random-bit-sequence circuit to output a random jitter signal in the form of N bits to be added to the least significant bits of the phase accumulator output.

13. A method of evaluating an integrated circuit, comprising:
 adding a controlled amount of jitter to a data clock signal and an edge clock signal;
 sampling an input signal to generate sampled data values in response to the data clock signal;
 sampling the input signal to generated sampled edge values in response to the edge clock signal; and
 computing a bit-error-ratio based on the sampled data values and an expected set of data values.

14. The method of claim 13, the step of computing includes: obtaining an error count value by comparing the expected set of data values with the sampled data values.

15. The method of claim 13, wherein the input signal is transmitted by a transmitter using a same reference clock as a receiver in the integrated circuit, and wherein the step of adding includes forcing a frequency offset between the transmitter and the receiver by adding a constant to an input of a phase accumulator coupled to the receiver.

16. The method of claim 13, wherein the integrated circuit includes a phase interpolator controlled by a set of codes, and wherein the step of adding includes adjusting the codes to the phase interpolator.

17. The method of claim 13, wherein the integrated circuit includes a frequency accumulator, and wherein the step of adding includes adding a square wave to an input of the frequency accumulator.

18. The method of claim 13, wherein the integrated circuit includes a phase interpolator having a control input, and wherein the step of adding includes adding a PRBS sequence to the control input of the phase interpolator.

19. The method of claim 13, wherein the step of adding includes:
 generating at least one jitter signal; and
 injecting the at least one jitter signal into a clock circuit that generates the data clock signal.

20. The method of claim 19, wherein the at least one jitter signal includes one or more of the group consisting of: a substantially square-wave signal, a substantially triangular wave signal, a substantially sinusoidal signal, an emulated random jitter signal, and a constant frequency offset signal.

21. The method of claim 19, wherein the at least one jitter signal has a controllable frequency, the method further comprising varying the frequency of the at least one jitter signal.

22. The method of claim 19, wherein the at least one jitter signal has a controllable amplitude, the method further comprising varying the amplitude of the at least one jitter signal.

* * * * *